(12) United States Patent
Acar et al.

(10) Patent No.: US 7,737,738 B2
(45) Date of Patent: Jun. 15, 2010

(54) FREQUENCY DIVIDER

(75) Inventors: Mustafa Acar, Enschede (NL); Dominicus Martinus Wilhelmus Leenaerts, Eindhoven (NL); Bram Nauta, Enschede (NL)

(73) Assignee: ST-Ericsson SA, Geneva (CH)

( * ) Notice: Subject to any disclaimer, the term of this patent is extended or adjusted under 35 U.S.C. 154(b) by 140 days.

(21) Appl. No.: 11/573,350

(22) PCT Filed: Jul. 27, 2005

(86) PCT No.: PCT/IB2005/052534

§ 371 (c)(1),
(2), (4) Date: Aug. 15, 2007

(87) PCT Pub. No.: WO2006/016312

PCT Pub. Date: Feb. 16, 2006

(65) Prior Publication Data

US 2008/0265953 A1    Oct. 30, 2008

(30) Foreign Application Priority Data

Aug. 6, 2004    (EP)    ................................ 04103804

(51) Int. Cl.
*H03K 21/00* (2006.01)
(52) U.S. Cl. .......................... 327/115; 327/117; 327/57
(58) Field of Classification Search .................. 327/57, 327/115, 117, 118, 215, 218; 377/47–48
See application file for complete search history.

(56) References Cited

U.S. PATENT DOCUMENTS

| 5,216,295 | A  | * | 6/1993  | Hoang ......................... 326/115 |
| 6,831,489 | B2 | * | 12/2004 | Cheung et al. ............... 327/115 |
| 6,842,054 | B2 | * | 1/2005  | Wang ........................... 327/115 |
| 7,403,048 | B2 | * | 7/2008  | Heidari et al. ............... 327/117 |

* cited by examiner

*Primary Examiner*—Long Nguyen

(57) ABSTRACT

A frequency divider comprising, a first latch circuit and a second latch circuit, the second latch circuit being crossed-coupled to the first latch circuit. Each latch comprises a respective sense amplifier coupled to a respective latch. The sense amplifiers comprise a first clock input for receiving a first clock signal. The latches comprise a second clock input for receiving a second clock signal having a second frequency, the second frequency being substantially double the first frequency.

Figure 1:
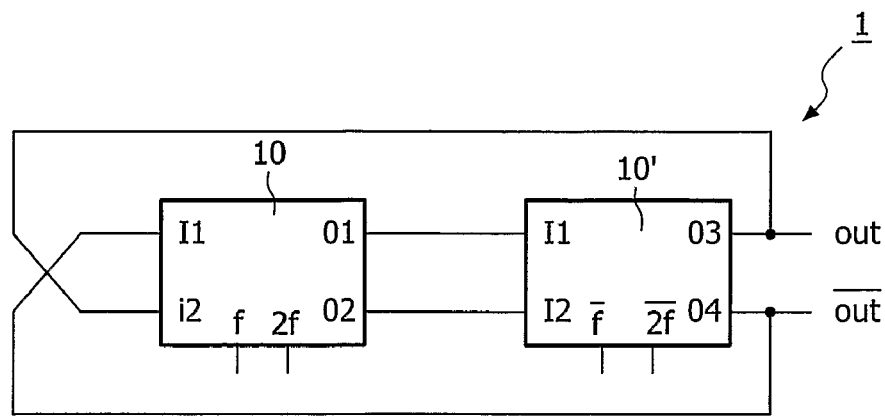

20 Claims, 2 Drawing Sheets

FREQUENCY DIVIDER

The invention refers to a frequency divider.

Frequency dividers are widely used in modern communication devices for dividing a clock signal having a frequency and obtaining another signal having a lower frequency than the frequency of the clock signal. Usually, frequency dividers are implemented using flip-flops or latch circuits. Because clock signals are binary signals i.e. having a HIGH value level and a LOW level, frequency division factors, which are powers of 2 are relatively easier to be implemented.

In modern communication circuits, differential signals are often used and, as a direct consequence frequency dividers adapted to differential signals were necessary.

U.S. Pat. No. 6,166,571 describes a frequency divider circuit for producing output signals of half the frequency of an input clock signal, which comprises two identical circuit sections, each producing an output signal and its complement. The circuit sections are connected to each other so that the output signals of one circuit section serve as input signals to the other circuit section. Each circuit section contains a load transistor, which is controlled by one of the clock signal and the clock signal complement, and a switch transistor, which is controlled by the other of the clock signal and the clock signal complement. The circuit exhibits a reduced RC time constant for each circuit section and an increased output signal swing between the output signals and their respective complements. It is observed that the frequency divider comprises two identical sections that are both clocked by the clock signal. The higher the frequency the lower the output signal swing between the output signal and their respective complements. There is therefore a need to have a frequency divider, which is operable at relatively high frequencies and providing relatively large voltage swing.

The invention is defined in the independent claim. The dependent claims define advantageous embodiments. The invention provides a frequency divider comprising:

a first latch circuit and a second latch circuit, the second latch circuit being crossed-coupled to the first latch circuit, each latch comprising a respective sense amplifier coupled to a respective latch, the sense amplifiers comprising a first clock input for receiving a first clock signal and respective complementary first clock signal having a first frequency, the latches comprising a second clock input for receiving a second clock signal and respective complementary second clock signal having a second frequency, the second frequency being substantially double the first frequency.

Throughout the present application it is considered that a complementary signal of a signal is the inverted signal.

During a time interval T/4-T/2 of the first clock signal, since the latch is active the gain of the respective sensing stage increases due to positive feedback applied by the latch. This result in a higher output swing compared to prior-art circuits.

In an embodiment of the invention, the first latch circuit is substantially identical to the second latch circuit. Each sense amplifier may comprise a differential pair of transistors including a first pair of transistors comprising a first transistor coupled to second transistor and a second pair of transistors comprising third transistor coupled to a fourth transistor. Each transistor has a drain, a source and a gate. It should be pointed out here that the invention is not limited to MOS transistors implementation and in a bipolar implementation each transistor has a collector, an emitter and a base corresponding to the drains, source and gate, respectively. A drain of the first transistor and a drain of the third transistor are coupled to a source of the second transistor and to a source of the fourth transistor, respectively. Gates of the second transistor and fourth transistor receive a signal generated by the other latch. Gates of the first transistor and the third transistor are coupled to the first clock input for receiving the first clock signal. It is observed that the role of the sense amplifier is to determine if an input signal is in a HIGH state or in a LOW state and to transmit the signals when the first clock signal is asserted.

In another embodiment of the invention, the latch comprises a pair of cross-coupled transistors, comprising a fifth transistor and a sixth transistor, each transistor having a drain, a gate and a source. The drain of the fifth transistor and the drain of the sixth transistor are coupled to the drain of the second transistor and to the drain of the fourth transistor, respectively. The source of the fifth transistor and the source of the sixth transistor are coupled to the drain of the of seventh transistor and to the drain of an eighth transistor, respectively. A gate of the seventh transistor and a gate of the eighth transistor receive the second clock signal. The crossed coupled transistors implements a negative resistance. The negative resistance is necessary for obtaining the latching property of the circuits and for having the necessary gain in the latches. Usually, the negative resistance is obtained using a crossed coupled pair of transistors.

Figure 2:
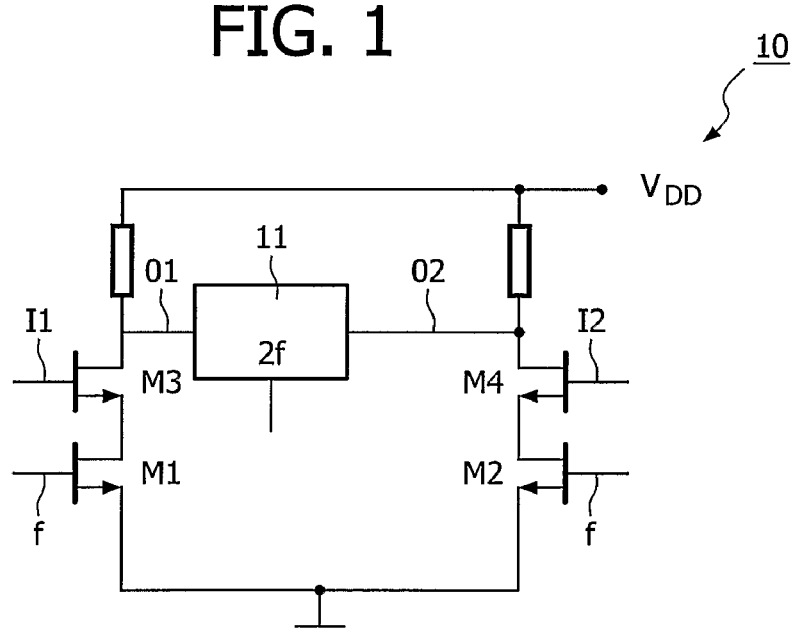
Figure 3:
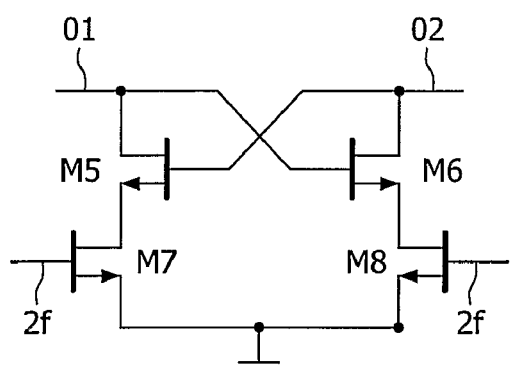
Figure 4:
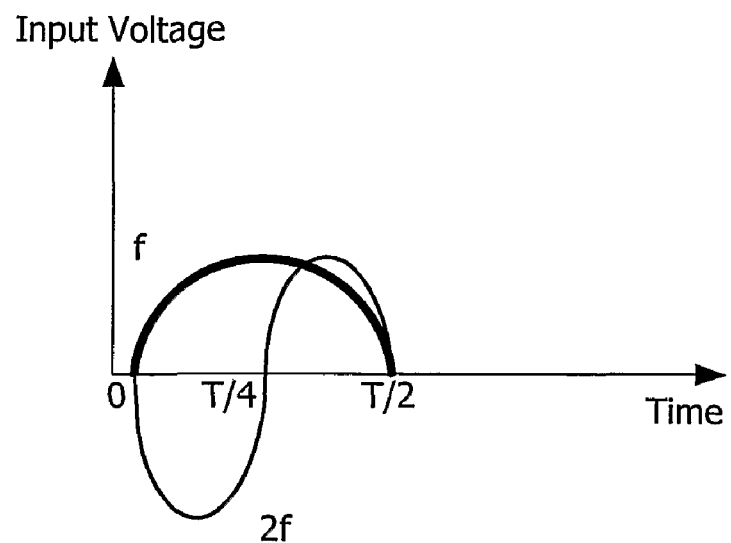
Figure 5:
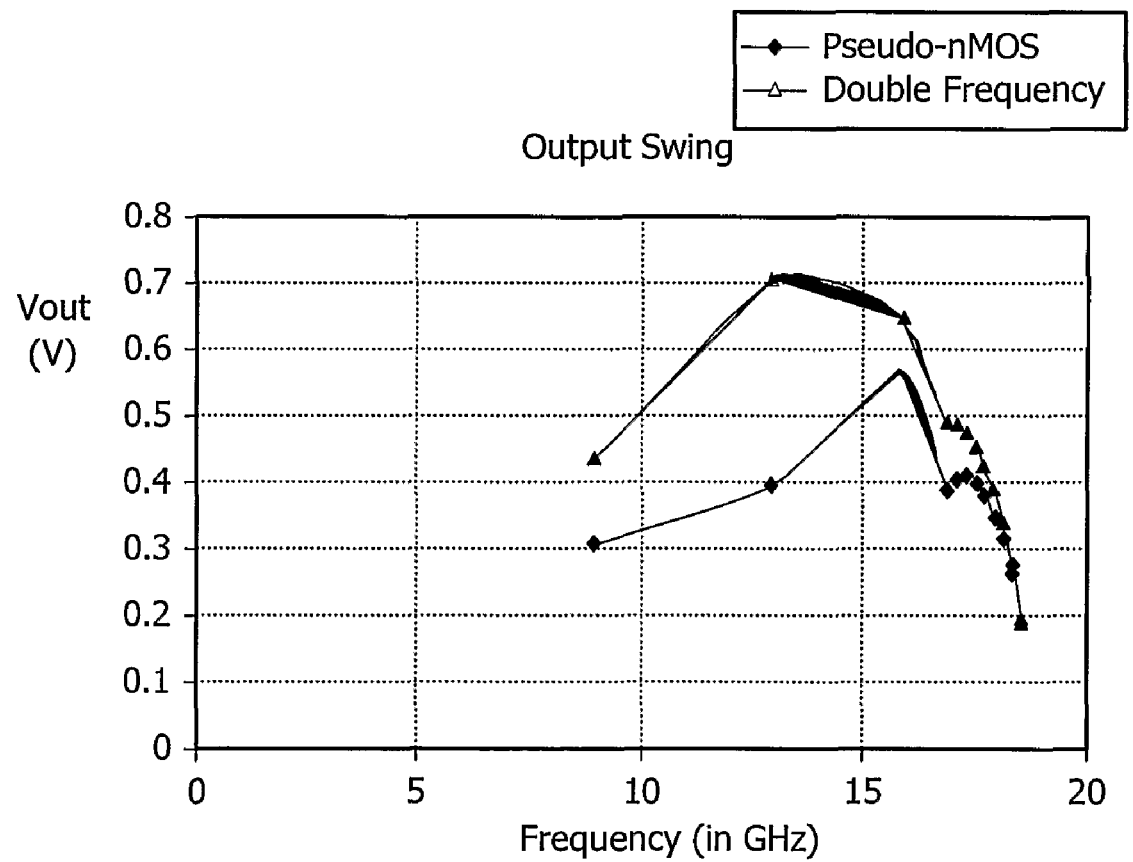

The above and other features and advantages of the invention will be apparent from the following description of the exemplary embodiments of the invention with reference to the accompanying drawings, in which:

FIG. 1 depicts a block level schematic of a frequency divider, according to an embodiment of the invention, FIG. 2 depicts a transistor level implementation of a sense amplifier, according to an embodiment of the invention, FIG. 3 depicts a transistor level implementation of a latch, according to an embodiment of the invention, FIG. 4 depicts a time diagram of a semi-period of the first clock signal, according to an embodiment of the invention, and FIG. 5 depicts an amplitude versus frequency diagram for the output signals, according to an embodiment of the invention.

FIG. 1 depicts a block level schematic of a frequency divider, according to an embodiment of the invention.

The frequency divider comprises a first latch circuit 10 and a second latch circuit 10', the second latch circuit 10' being crossed-coupled to the first latch circuit 10. The first latch circuit 10 comprises a first input I1 and a first complementary input I2 and a first output O1 and a first complementary output O2.

The second latch 10' comprises a second input I3 and a second complementary input I4 and a second output O3 and a second complementary output O4. The outputs of the first latch 10 are coupled to the corresponding inputs of the second latch 10' i.e. O1 to I3 and O2 to I4. The outputs of the second latch 10' are coupled to the complementary inputs of the first latch 10 i.e. O3 to I2 and O4 to I1 i.e. the first latch 10 and the second latch are crossed-coupled. Each latch circuit comprises a respective sense amplifier coupled to a respective latch (11). The sense amplifiers comprising a first clock input for receiving a first clock signal f; $\bar{f}$ and having a first frequency. In some embodiments, the first clock signal may a complementary first clock signal. The latches 11 comprise a second clock input $2f$; $\overline{2f}$ for receiving a second clock signal and having a second frequency, the second frequency being substantially double the first frequency. In some embodiments, the second clock signal may be a complementary second clock signal. It is understood that in yet other embodiments the first clock signal may receive both a first clock signal and a complementary first clock signal, and the second clock input may receive both a second clock signal and a complementary second clock signal.

During a time interval T/4-T/2 of the first clock signal, since the latch is active the gain of the respective sensing stage increases due to positive feedback applied by the latch as shown in FIG. 4. This result in a higher output swing compared to prior-art circuits as shown in FIG. 5. It is remarked that when the circuit uses relatively high frequency signals e.g. in GHz range the shape of the signals are no longer rectangular.

FIG. 2 depicts a transistor level implementation of a sense amplifier, according to an embodiment of the invention. The sense amplifier comprises a differential pair of transistors M1, M3; M2, M4 including a first pair of transistors comprising a first transistor M1 coupled to second transistor M3 and a second pair of transistors comprising third transistor M2 coupled to a fourth transistor M4. Each transistor has a drain, a source and a gate. A drain of the first transistor M1 and a drain of the third transistor M2 are coupled to a source of the second transistor M3 and to a source of the fourth transistor M4 respectively. Gates of the second transistor M3 and fourth transistor M4 receive a signal generated by the other latch. Gates of the first transistor M1 and the third transistor M2 are coupled to the first clock input f for receiving the first clock signal. The drain of the second transistor M3 and the drain of the fourth transistor M4 are coupled to the latch 11. A possible implementation of the latch 11 is shown in FIG. 3.

FIG. 3 depicts a transistor level implementation of a latch, according to an embodiment of the invention. The latch comprises a pair of cross-coupled transistors M5, M6, comprising a fifth transistor M5 and a sixth transistor M6, each transistor having a drain, a gate and a source. A drain of the fifth transistor M5 and a drain of the sixth transistor M6 are coupled to the drain of the second transistor M3 and to the drain of the fourth transistor M4, respectively. A source of the fifth transistor M5 and a source of the sixth transistor M6 are coupled to the drain of the of seventh transistor M7 and to a drain of an eighth transistor M8, respectively. A gate of the seventh transistor M7 and a gate of the eighth transistor M8 receive the second clock signal 2f. The crossed coupled transistors implements a negative resistance. The negative resistance is necessary for obtaining the latching property of the circuits and for having the necessary gain in the latches. Usually, the negative resistance is obtained using a crossed coupled pair of transistors.

It is observed that in the embodiments, only N-MOS transistors are presented. It is understood that a skilled person in the art could apply the teachings of the invention using P-MOS, CMOS, BiCMOS or other type of transistors implemented in a different technology. It is further pointed out here that in a bipolar implementation each transistor has a collector, an emitter and a base corresponding to the drain, source and gate, respectively, and that the scope of a claim reciting a drain, source or gate is not so limited as to exclude bipolar implementations.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed processor. The invention resides in each new feature or combination of features.

The invention claimed is:

1. A frequency divider comprising:
a first latch circuit and a second latch circuit, the second latch circuit being cross-coupled to the first latch circuit, each latch circuit comprising a respective sense amplifier coupled to a respective latch device,
the respective sense amplifier of each latch circuit comprising a first clock input for receiving a respective one of a first clock signal and a complementary first clock signal having a first frequency, and
the respective latch device of each latch circuit comprising a second clock input for receiving a respective one of a second clock signal having a second clock frequency the second frequency being substantially double the first frequency.

2. A frequency divider as in claim 1, wherein the first latch circuit is substantially identical to the second latch circuit.

3. A frequency divider as claimed in claim 1, wherein each sense amplifier comprises a differential pair of transistors including:
a first pair of transistors comprising a first transistor coupled to a second transistor,
second pair of transistors comprising third transistor coupled to a fourth transistor,
each transistor having a drain, a source and a gate,
the drain of the first transistor and the drain of the third transistor being coupled to the source of the second transistor and to the source of the fourth transistor respectively,
each of the gates of the second transistor and the fourth transistor receiving a signal generated by the other latch,
the gates of the first transistor and the third transistor being coupled to the first clock input for receiving the respective one of the first clock signal and the complementary first clock signal.

4. A frequency divider as claimed in claim 3, wherein at least one latch comprises:
a pair of cross-coupled transistors comprising a fifth transistor and a sixth transistor, each transistor having a drain, a gate and a source,
the drain of the fifth transistor and the drain of the sixth transistor being coupled to the drain of the second transistor and to the drain of the fourth transistor respectively,
a seventh transistor and an eighth transistor, each transistor having a drain, a gate, and a source, wherein the source of the fifth transistor and the source of the sixth transistor being coupled to the drain of the seventh transistor and to the drain of an eighth transistor respectively,
the gate of the seventh transistor and a gate of the eighth transistor receiving the second clock signal.

5. A frequency divider comprising:
a first latch circuit and a second latch circuit, the second latch circuit being cross-coupled to the first latch circuit, wherein the first latch circuit comprises a first sense amplifier coupled to a first latch device and the second latch circuit comprises a second sense amplifier coupled to a second latch device,
wherein the first and second sense amplifiers comprise a first and second clock input, and wherein the first clock input receives a first clock signal having a first frequency, and wherein the second clock input receives a second clock signal which is substantially twice the first frequency.

6. The frequency divider of claim 5, wherein the first latch circuit is substantially identical to the second latch circuit.

7. The frequency divider of claim 5, wherein at least one sense amplifier comprises a differential pair of transistors.

8. The frequency divider of claim 7, wherein the pair of differential transistors comprise a first, second, third, and fourth transistor, wherein the first and second transistor are coupled together for form a first pair of transistors, and the third and fourth transistors are coupled together to form a second pair of transistors.

9. The frequency divider of claim 8, wherein each transistor comprises a drain, a source, and a gate, and wherein the drain of the first transistor is coupled to the source of the second transistor.

10. The frequency divider of claim 9, wherein the drain of the third transistor is coupled to the source of the fourth transistor.

11. The frequency divider of claim 10, wherein each of the gates of the second transistor and the fourth transistor receiving a signal generated by the other latch.

12. The frequency divider of claim 11, wherein the gates of the first transistor and the third transistor being coupled to the first clock input for receiving the respective one of the first clock signal and the complementary first clock signal.

13. The frequency divider of claim 12, wherein at least one latch comprises:
a pair of cross-coupled transistors comprising a fifth transistor and a sixth transistor, each transistor having a drain, a gate and a source, wherein the drain of the fifth transistor and the drain of the sixth transistor being coupled to the drain of the second transistor and to the drain of the fourth transistor respectively.

14. The frequency divider of claim 13, wherein the at least one latch further comprises:
a seventh transistor and an eighth transistor, each transistor having a drain, a gate, and a source, wherein the source of the fifth transistor and the source of the sixth transistor being coupled to the drain of the seventh transistor and to the drain of an eighth transistor respectively, wherein the gate of the seventh transistor and a gate of the eighth transistor receiving the second clock signal.

15. A method, comprising:
receiving a first clock signal and a complementary first clock signal having a first frequency into a circuit comprising a first latch circuit and a second latch circuit, wherein the second latch circuit is cross-coupled to the first latch circuit, and wherein each latch circuit comprises a respective sense amplifier coupled to a respective latch device, receiving a second clock signal into the circuit, wherein the second clock signal has a second frequency that is approximately twice the first frequency of the first clock signal; and dividing a frequency using the circuit.

16. The method of claim 15, wherein the first latch circuit is substantially identical to the second latch circuit.

17. The method of claim 15, wherein at least one sense amplifier comprises a differential pair of transistors.

18. The method of claim 17, wherein the pair of differential transistors comprise a first, second, third, and fourth transistor, wherein the first and second transistor are coupled together for form a first pair of transistors, and the third and fourth transistors are coupled together to form a second pair of transistors.

19. The method of claim 18, wherein each transistor comprises a drain, a source, and a gate, and wherein the drain of the first transistor is coupled to the source of the second transistor.

20. The method of claim 19, wherein the drain of the third transistor is coupled to the source of the fourth transistor.

* * * * *